(12) United States Patent
Ahtikari

(10) Patent No.: US 11,597,292 B2
(45) Date of Patent: Mar. 7, 2023

(54) METHOD, APPARATUS AND COMPUTER PROGRAM PRODUCT FOR MONITORING ENERGY CONSUMPTION IN AN ELECTRIC VEHICLE CHARGING NETWORK

(71) Applicant: LIIKENNEVIRTA OY / VIRTA LTD, Helsinki (FI)

(72) Inventor: Jussi Ahtikari, Helsinki (FI)

(73) Assignee: LIIKENNEVIRTA OY / VIRTA LTD, Helsinki (FI)

( * ) Notice: Subject to any disclaimer, the term of this patent is extended or adjusted under 35 U.S.C. 154(b) by 84 days.

(21) Appl. No.: 17/049,296

(22) PCT Filed: Apr. 29, 2020

(86) PCT No.: PCT/FI2020/050278
§ 371 (c)(1),
(2) Date: Oct. 20, 2020

(87) PCT Pub. No.: WO2020/221959
PCT Pub. Date: Nov. 5, 2020

(65) Prior Publication Data
US 2021/0362615 A1    Nov. 25, 2021

(30) Foreign Application Priority Data
Apr. 29, 2019 (FI) ..................... 20195345

(51) Int. Cl.
*B60L 53/62* (2019.01)
*G06F 16/29* (2019.01)
(Continued)

(52) U.S. Cl.
CPC .............. *B60L 53/62* (2019.02); *B60L 53/68* (2019.02); *G01R 22/063* (2013.01); *G01R 22/10* (2013.01); *G06F 16/29* (2019.01); *G06Q 50/06* (2013.01)

(58) Field of Classification Search
CPC .......... B60L 53/62; B60L 53/68; G06F 16/29; G01R 22/063; G01R 22/10; G06Q 50/06
See application file for complete search history.

(56) References Cited

U.S. PATENT DOCUMENTS

2010/0076825 A1*  3/2010  Sato ........................ B60L 53/64
                                                              705/14.1
2011/0153474 A1    6/2011  Tormey et al.
(Continued)

FOREIGN PATENT DOCUMENTS

EP        2645514 A1    10/2013
JP     2010081722 A      4/2010
(Continued)

OTHER PUBLICATIONS

International Search Report for PCT/FI2020/050278 dated Jul. 17, 2020 (5 pages).
(Continued)

*Primary Examiner* — Bryan Bui
(74) *Attorney, Agent, or Firm* — Alston & Bird LLP

(57) ABSTRACT

Provided is a technique for monitoring energy consumption in an electric vehicle (EV) charging network. The technique is based on using messages from one or more EV charging stations, each of which comprises a timestamp, a station ID, a charging session ID, and an energy meter reading. Whenever a new message is received, it is first stored in a database, whereupon it is checked whether the database comprises an older message with the same station ID and charging session ID as the new message. If the older message is present in the database, a time difference and an energy difference between the new and older messages are calculated. Then, a time granularity level is selected based on the time difference. An energy consumption distribution between the timestamps of the new and older messages is
(Continued)

obtained based on the time granularity level and the energy difference.

17 Claims, 4 Drawing Sheets

(51) Int. Cl.
*B60L 53/68* (2019.01)
*G01R 22/06* (2006.01)
*G01R 22/10* (2006.01)
*G06Q 50/06* (2012.01)

(56) References Cited

U.S. PATENT DOCUMENTS

2013/0335005 A1 12/2013 Ohama
2014/0354228 A1* 12/2014 Williams ............... B60L 53/18
320/109

FOREIGN PATENT DOCUMENTS

| | | |
|---|---|---|
| JP | 2012-210039 A | 10/2012 |
| JP | 2013037640 A | 2/2013 |
| KR | 101920058 B1 | 11/2018 |
| WO | WO-2010/140664 | 12/2010 |
| WO | WO-2011/151844 | 12/2011 |

OTHER PUBLICATIONS

Search Report for Finnish Application No. 20195345 dated Aug. 23, 2019 (1 page).

Xiong Yingqi et al., *Electric Vechicle Driver Clustering Using Statistical Model and Maching Learning*, Power & Energy Society General Meeting (PESGM), IEEE, Aug. 5, 2018 (6 pages).

Zeming Jiang et al., *Statistical analysis of electric vehicles charging, station usage and impact on the grid*, Power & Energy Society Innovative Smart Grid Technologies (ISGT), IEEE, Sep. 6, 2016 (6 pages).

Notice of Reasons for Rejection for Japanese Application No. 2020-556253 dated Jan. 25, 2022.

* cited by examiner

METHOD, APPARATUS AND COMPUTER PROGRAM PRODUCT FOR MONITORING ENERGY CONSUMPTION IN AN ELECTRIC VEHICLE CHARGING NETWORK

CROSS-REFERENCE TO RELATED APPLICATIONS

This application is a national phase entry of International Application No. PCT/FI2020/050278, filed Apr. 29, 2020, which claims priority to Finnish Application No. 20195345, filed Apr. 29, 2019, the entire contents of which are incorporated herein by reference.

TECHNICAL FIELD

The present disclosure relates generally to electric vehicles, and more specifically, to a method, apparatus, and computer program product for monitoring energy consumption in an electric vehicle (EV) charging network.

BACKGROUND

At the present time, electric vehicles are being used more frequently for land, sea and air travel. However, due to a limited battery capacity, the electric vehicles often need to be charged one or more times at EV charging stations located on the way to destination points. The location and density of the EV charging stations directly depend on the use rate of the electric vehicles within a geographical area of interest. It is therefore important to know how often EV owners use particular EV charging stations during the day, in order to optimize EV charging and energy production at those EV charging stations.

Given the above, each EV charging station is usually equipped with an energy meter configured to take energy measurements at a given time and send information about the energy measurements to a specialized data center for further processing. However, different EV charging stations may send such information by using different communication protocols and time intervals. On top of that, there may be errors such as data communication problems, which cause the EV charging stations to miss sending the above-mentioned information to the data center. All of this does not allow obtaining a suitable accuracy of energy consumption distribution in time, and makes it difficult or even impossible to calculate a total average energy consumed by the electric vehicles at the EV charging stations of interest at a certain time.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object of the present disclosure to provide a technical solution that allows one to obtain a more accurate energy consumption distribution in time at each of EV charging stations of interest, and provide based thereon the calculation of the total average energy consumed by electric vehicles at the EV charging stations of interest at a certain time.

The object above is achieved by the features of the independent claims in the appended claims. Further embodiments and examples are apparent from the dependent claims, the detailed description and the accompanying drawings.

According to a first aspect, a method for monitoring energy consumption in an electric vehicle (EV) charging network is provided. The EV charging network comprises multiple EV charging stations each equipped with an energy meter. The method starts with the step of receiving a new message from at least one of the EV charging stations. The new message comprises a timestamp, a station identifier (ID), a charging session ID unique for each charging session, and an energy meter reading. The method next proceeds to the step of storing the new message in a database comprising similar old messages from the EV charging stations. The method further comprises the step of checking whether the database comprises an older message comprising the same station ID and charging session ID as the new message. If said older message is present in the database, the method proceeds to the step of calculating a time difference and an energy difference between the new message and the older message. The method further comprises the steps of selecting a time granularity level based on the calculated time difference, and obtaining an energy consumption distribution between the timestamps of the new message and the older message based on the time granularity level and the energy difference. By so doing, it is possible to obtain information about changes in energy consumption over time at the EV charging stations, which in turn can be used to optimize EV charging and energy production at the EV charging stations.

In one implementation form of the first aspect, the station ID comprises a name, manufacturer information and/or geographical location of the EV charging station. This allows obtaining more detailed information about the EV charging stations of interest.

In one implementation form of the first aspect, the charging session ID is represented by one or more letter and/or digital characters. This simplifies the distinction between the charging sessions at each EV charging station.

In one implementation form of the first aspect, the timestamp is presented in accordance with the ISO 8601 standard. This makes the method more flexible in use.

In one implementation form of the first aspect, the method further comprises storing the energy consumption distribution in the database. By so doing, one may monitor the time history of energy consumption at a particular EV charging station more easily and efficiently.

In one implementation form of the first aspect, the step of obtaining the energy consumption distribution comprises: dividing the time difference between the new message and the older message into a number of equal time intervals in accordance with the time granularity level; and calculating an average energy consumption for each time interval by dividing the energy difference by the number of equal time intervals. This allows controlling how the average energy consumption changes over time.

In one implementation form of the first aspect, the energy meter readings and the average energy consumption are given in Watt-hour or Watt-hour multiples. This makes the method more flexible in use.

In one implementation form of the first aspect, the method further comprises the steps of: calculating an average power consumption for each time interval by converting the average energy consumption expressed in Watt-hour or Watt-hour multiples into Watt; obtaining a power consumption distribution in time between the new message and the older message based on the time granularity level and the average power consumption; and storing the power consumption distribution in the database. This power consumption distribution may help optimize EV charging and energy production at a particular EV charging station more efficiently.

In one implementation form of the first aspect, the above-indicated steps of the method are repeated for the new messages received from the other EV charging stations. In this case, the method further comprises the step of calculating a total energy consumption in the EV charging network at a given time by comparing the energy consumption distributions obtained for the other EV charging stations. This may help optimize EV charging and energy production at the EV charging stations of interest more efficiently.

According to a second aspect, an apparatus for monitoring energy consumption in an electric vehicle (EV) charging network is provided. The EV charging network comprises multiple EV charging stations each equipped with an energy meter. The apparatus comprises at least one processor, and a memory coupled to the at least one processor and storing a database comprising old messages from the EV charging stations. Each of the old messages comprises a timestamp, a station identifier (ID), a charging session ID unique for each charging session, and an energy meter reading. The memory further stores processor-executable instructions which, when executed by the at least one processor, cause the at least one processor to: receive a new message from at least one of the EV charging stations; store the new message in the database; check whether the database comprises an older message comprising the same station ID and charging session ID as the new message; if the older message is present in the database, calculate a time difference and an energy difference between the new message and the older message; select a time granularity level based on the calculated time difference; and obtain an energy consumption distribution between the timestamps of the new message and the older message based on the time granularity level and the energy difference. By so doing, it is possible to obtain information about changes in energy consumption over time at the EV charging stations, which in turn can be used to optimize EV charging and energy production at the EV charging stations.

In one implementation form of the second aspect, the station ID comprises a name, manufacturer information and/or geographical location of the EV charging station. This allows obtaining more detailed information about the EV charging stations of interest.

In one implementation form of the second aspect, the charging session ID is represented by one or more letter and/or digital characters. This simplifies the distinction between the charging sessions at each EV charging station.

In one implementation form of the second aspect, the timestamp is presented in accordance with the ISO 8601 standard. This makes the apparatus more flexible in use.

In one implementation form of the second aspect, the memory further store instructions causing the at least one processor to store the energy consumption distribution in the database. By so doing, one may monitor the time history of energy consumption at a particular EV charging station more easily and efficiently.

In one implementation form of the second aspect, the at least one processor is configured to obtain the energy consumption distribution by: dividing the time difference between the new message and the older message into a number of equal time intervals in accordance with the time granularity level; and calculating an average energy consumption for each time interval by dividing the energy difference by the number of equal time intervals. This allows understanding how the average energy consumption changes over time.

In one implementation form of the second aspect, the energy meter readings and the average energy consumption are given in Watt-hour or Watt-hour multiples. This makes the apparatus more flexible in use.

In one implementation form of the second aspect, the memory further stores instructions causing the at least one processor to: calculate an average power consumption for each time interval by converting the average energy consumption expressed in Watt-hour or Watt-hour multiples into Watt; obtain a power consumption distribution in time between the new message and the older message based on the time granularity level and the average power consumption; and store the power consumption distribution in the database. This power consumption distribution may help optimize EV charging and energy production at a particular EV charging station more efficiently.

In one implementation form of the second aspect, the at least one processor is configured to repeat the above-indicated operations for new messages received from the other EV charging stations. In this case, the memory further stores instructions causing the at least one processor to calculate a total energy consumption in the EV charging network at a given time by comparing the energy consumption distributions obtained for the other EV charging stations. This may help optimize EV charging and energy production at the EV charging stations of interest more efficiently.

According to a third aspect, a computer program product comprising a computer-readable storage medium storing a computer program is provided. Being executed by at least one processor, the computer program causes the at least one processor to perform the method according to the first aspect. Thus, the method according to the first aspect can be embodied in the form of the computer program, thereby providing flexibility in use thereof.

Other features and advantages of the present disclosure will be apparent upon reading the following detailed description and reviewing the accompanying drawings.

BRIEF DESCRIPTION OF THE DRAWINGS

The essence of the present disclosure is explained below with reference to the accompanying drawings in which.

DETAILED DESCRIPTION

Various embodiments of the present disclosure are further described in more detail with reference to the accompanying drawings. However, the present disclosure can be embodied in many other forms and should not be construed as limited to any certain structure or function disclosed in the following description. In contrast, these embodiments are provided to make the description of the present disclosure detailed and complete.

According to the present disclosure, it will be apparent to those skilled in the art that the scope of the present disclosure covers any embodiment, which is disclosed herein, irrespective of whether this embodiment is implemented independently or in concert with any other embodiment of the present disclosure. For example, the apparatus and method disclosed herein can be implemented by using any numbers of the embodiments provided herein. Furthermore, it should be understood that any embodiment of the present disclosure can be implemented using one or more of the elements or steps presented in the appended claims.

As used herein, the term "energy" relates to electrical energy produced by one or more electric generators arranged either at an EV charging station or at a remote electric plant. In the latter case, the electrical energy may be provided to the EV charging station via cables or as removable batteries. Correspondingly, the term "energy consumption" refers to the consumption of the electrical energy thus produced and stored at the EV charging stations.

Figure 1:
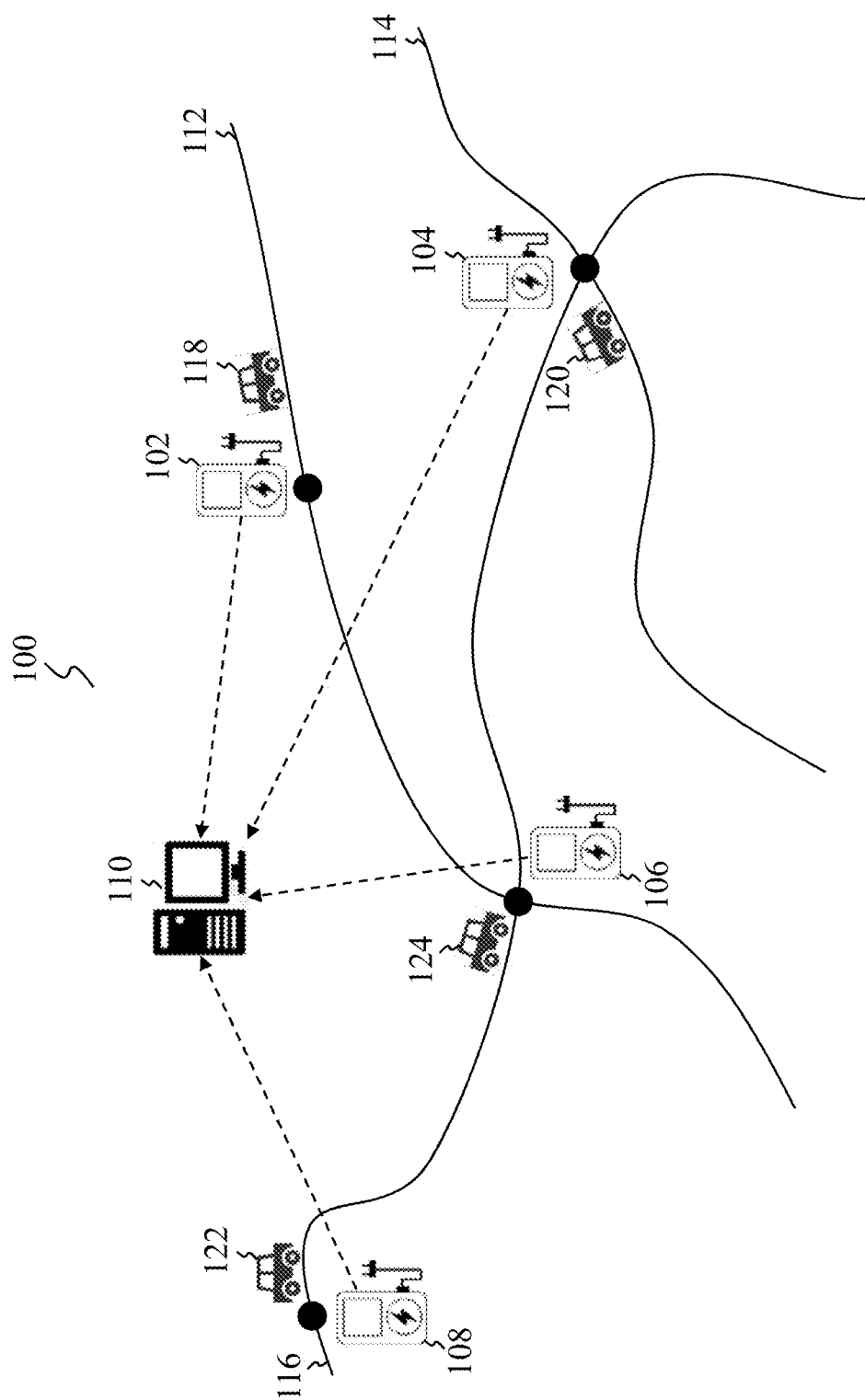
FIG. 1 shows an example of a typical EV charging network.

FIG. 1 shows an exemplary EV charging network 100 typically deployed in a geographical region of interest. In particular, the EV charging network 100 comprises four EV charging stations 102, 104, 106, and 108, and a data center 110. In turn, the geographical region of interest is exemplified by three roads 112, 114, and 116, with four electric cars 118, 120, 122, and 124 moving thereon. The location of each EV charging station is schematically shown as a solid circle in FIG. 1. As can be seen, the EV charging station 102 is located along the road 112, the EV charging station 104 is located at the intersection of the roads 114 and 116, the EV charging station 106 is located at the intersection of the roads 112 and 116, and the EV charging station 108 is located along the road 116. Moreover, each of the EV charging stations 102, 104, 106, and 108 is intended to be equipped with an energy meter configured to take energy measurements at some time and send a message about the energy measurements to the data center 110, as schematically shown by dashed arrows in FIG. 1. The message may comprise a timestamp, a station identifier (ID), a charging session ID unique for each charging session, and an energy meter reading, so that the data center 110 could properly distinguish between the messages sent from the EV charging stations 102, 104, 106, and 108.

Let us now consider a situation in which the car 118 is being charged at the EV charging station 102, the car 120 is being charged at the EV charging station 104, the car 122 is being charged at the EV charging station 108, and the car 124 is being charged at the EV charging station 106. In this situation, the energy meters of the EV charging stations 102, 104, 106, and 108 may send the following text messages to the data center 110:

2018-05-10 11:00:05-Station 102-Charge ID 10-meter reading: 1100 Wh;
2018-05-10 11:05:23-Station 104-Charge ID 13-meter reading: 436 Wh;
2018-05-10 11:06:25-Station 102-Charge ID 10-meter reading: 1145 Wh;
2018-05-10 11:10:15-Station 106-Charge ID 27-meter reading: 9923 Wh;
2018-05-10 11:11:45-Station 104-Charge ID 13-meter reading: 550 Wh;
2018-05-10 11:12:30-Station 108-Charge ID 30-meter reading: 12340 Wh;
2018-05-10 11:16:23-Station 102-Charge ID 10-meter reading: 1240 Wh.

From the messages above, one can easily make the following conclusions. Firstly, the energy meters of the EV charging stations 102, 104, 106, and 108 may send the messages at different times. Secondly, the energy meter of each EV charging station may send the messages at irregular intervals, as can be easily seen from the timestamps of the messages sent from the EV charging station 102. This irregularity may be caused by errors such as data communication problems, for which reason the EV charging station 102 could miss sending the message at some time. Given these conclusions, one problem is exposed, which relates to the impossibility of calculating a total energy consumption in the EV charging network 100 at a certain time. For example, relative to the messages above, it is impossible to determine what total energy consumption was at 2018-05-10 11:10:00.

Another problem may be caused by different message formats which the energy meters of the EV charging stations 102, 104, 106, and 108 may use to send the energy readings to the data center 110. For example, the energy readings sent by the energy meters of the EV charging stations 102 and 104 may look like "enrg=XXX", while the energy readings sent by the energy meters of the EV charging stations 106 and 108 may be presented as follows: "<energy>XXX</energy>". This may complicate the processing of the messages from the EV charging stations.

The present disclosure provides a technical solution for monitoring energy consumption in an electric vehicle (EV) charging network, with the technical solution being capable of mitigating or even eliminating the problems indicated above. Although the aspects of the technical solution are discussed below with reference to electric cars, one should not consider this as any limitation. In other words, the aspects of the technical solution disclosed herein may be equally used in relation to other kinds of electric vehicles, such as electric aircrafts and vessels. In case of the electric aircrafts, the EV charging stations 102, 104, 106, and 108 may be located at different airports. Being applicable to the electric vessels, the EV charging stations 102, 104, 106, and 108 may be located at different seaports.

Figure 2:
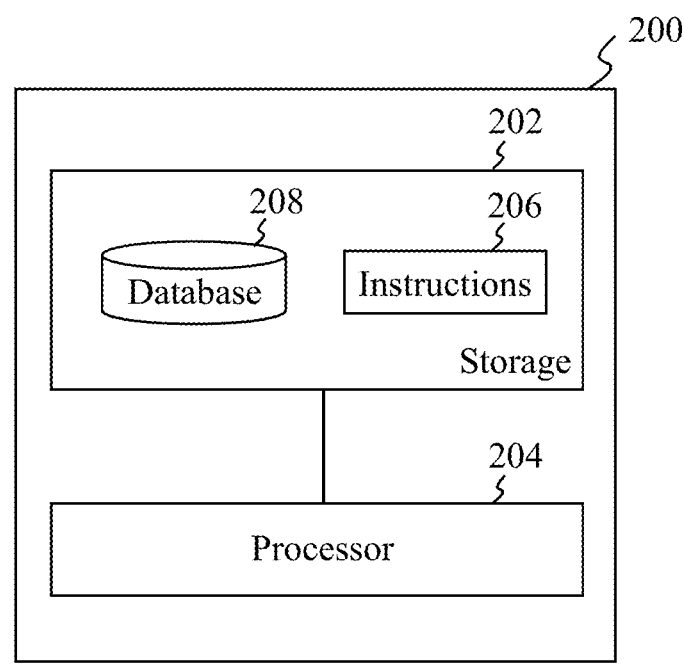
FIG. 2 shows a block-scheme of an apparatus for monitoring energy consumption in the EV charging network in accordance with one aspect of the present disclosure.

FIG. 2 shows a block-scheme of an apparatus 200 for monitoring energy consumption in an EV charging network in accordance with one aspect of the present disclosure. For simplicity, the EV charging network is intended to be the same as that shown in FIG. 1. In this case, the apparatus 200 is intended to be arranged in the data center 110 of the EV charging network 100. As shown in FIG. 2, the apparatus 200 comprises a storage 202 and a processor 204 coupled to the storage 202. The storage 202 stores processor executable instructions 206 to be executed by the at least one processor 204 to monitor the energy consumption in the EV charging network 100. The memory 202 further comprises a database 208 storing old messages from the energy meters of the EV charging stations 102, 104, 106, and 108.

The storage 202 may be implemented as a nonvolatile or volatile memory used in modern electronic computing machines. As an example, the nonvolatile memory may include Read-Only Memory (ROM), ferroelectric Random-Access Memory (RAM), Programmable ROM (PROM), Electrically Erasable PROM (EEPROM), solid state drive (SSD), flash memory, magnetic disk storage (such as hard drives and magnetic tapes), optical disc storage (such as CD, DVD and Blu-ray discs), etc. As for the volatile memory, examples thereof include Dynamic RAM, Synchronous DRAM (SDRAM), Double Data Rate SDRAM (DDR SDRAM), Static RAM, etc.

The processor 204 may be implemented as a central processing unit (CPU), general-purpose processor, single-purpose processor, microcontroller, microprocessor, application specific integrated circuit (ASIC), field programmable gate array (FPGA), digital signal processor (DSP), complex programmable logic device, or the like. It is worth noting that the processor 204 may be implemented as any combination of the aforesaid. As an example, the processor 204 may be a combination of two or more CPUs, general-purpose processors, etc.

The processor executable instructions 206 stored in the storage 202 may be configured as a computer executable code causing the processor 204 to perform the aspects of the present disclosure. The computer executable code for carrying out operations or steps for the aspects of the present disclosure may be written in any combination of one or more programming languages, such as Java, C, C++, Python, or the like. In some examples, the computer executable code may be in the form of a high-level language or in a pre-compiled form, and be generated by an interpreter (also pre-stored in the storage 202) on the fly.

The database 208 may be structured in a tabular form, with each row corresponding to one of the messages received from the EV charging stations, like those shown in FIG. 1, and each column corresponding to a certain attribute of that message, such as the timestamp, the station ID, the charging session ID, or the energy meter reading. In one other embodiment, the database 208 may be configured as a set of tables, with each table being associated with the messages received from the same EV charging station. At the same time, the processor 204 may be configured to query and maintain the database 208 by using any suitable programming language, for example, Structured Query Language (SQL).

Figure 3:
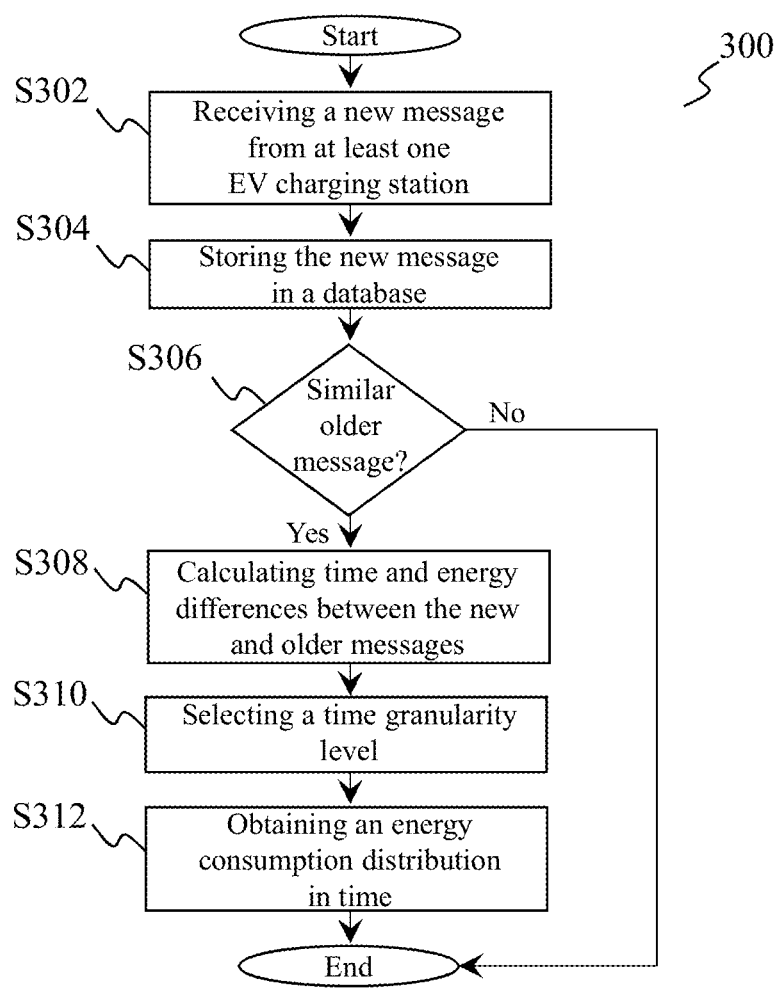
FIG. 3 shows a block-scheme of a method for monitoring energy consumption in the EV charging network in accordance with another aspect of the present disclosure.

FIG. 3 shows a flowchart for a method 300 for monitoring the energy consumption in the EV charging network in accordance with another aspect of the present disclosure. The method 300 is intended to be performed by the processor 204 of the apparatus 200 when the processor 204 is caused to execute the processor executable instructions 206.

In particular, the method 300 starts with the step S302, in which the processor 204 receives a new message from at least one of the EV charging stations 102, 104, 106, and 108. Similar to the old messages, the new message comprises the timestamp, the station ID, the charging session ID, and the energy meter reading. It should be noted that each of said message attributes may be presented differently. For example, the station ID may comprise a name, manufacturer information and/or geographical location of the EV charging station. As for the charging session ID, it may be represented by one or more letter and/or digital characters. It should be apparent that the charging session ID is selected for each next charging session in ascending order. The timestamp may be presented in accordance with the ISO 8601 standard covering the exchange of date- and time-related data. The energy meter reading may be expressed in different energy units, but the watt-hour (Wh) and its multiples, such, for example, as kilowatt-hour (kWh), are most common in the context of electrical applications.

Once the new message is received, the method 300 proceeds to step S304, in which the processor 204 accesses the database 208 in order to make therein a new entry about the new message. This means that the processor 204 creates a new row in the database 208 and fills in the new row with attribute values indicated in the new message.

Next, the method 300 proceeds to step S306, in which the processor 204 checks whether the database 208 comprises an older message comprising the same station ID and charging session ID as the new message. For this purpose, the processor 204 may use SQR queries to retrieve respective data from the database 208. If there is no older message with the above-requested message attributes, then the method 300 ends up. However, if the database 208 comprises such an older message, the method proceeds further.

In step S308, the processor 204 calculates a time difference and an energy difference between the new message and the suitable older message found in the database 208. The time difference is calculated by comparing the timestamps of the new and older messages. For example, if the new and older messages are received during one minute, the time difference may be given in seconds. As for the energy difference, it is calculated based on the energy meter readings of the new and older messages.

Further, the method proceeds to step S310, in which the processor 204 selects a time granularity level based on the calculated time difference. Next, in step S312 of the method 300, the processor 204 divides the energy difference evenly between the two timestamps of the new and older messages in accordance with the time granularity level. By so doing, the processor 204 eventually obtains an energy consumption distribution between the two timestamps of the new and older messages. After that, the method 300 ends up.

Let us now give one example of how the method 300 is applied to the messages from the EV charging stations. Assuming that the data center 110 of the EV charging network 100 receives a new message from the EV charging station 102, according to which the energy meter reading is equal to 110 Wh at 10:05. It is also assumed that the database 108 stored in the memory 202 of the apparatus 200 comprises an older message comprising the same station ID and charging session ID as the new message, as well as the energy meter reading equal to 100 Wh at 10:00. Given these initial data, one may proceed to perform the method 300 as follows. At first, it is determined that the time difference is 5 minutes and the energy difference is 10 Wh. In this case, it is reasonable to choose one minute as the time granularity level. With the time granularity level thus chosen, there are five one-minute intervals between the timestamps of the new and older messages. Next, the energy difference is divided evenly between the five one-minute intervals, which means 10/5=2 Wh/min. In other words, this example results in the creation of the following five data fields: 10:01-2 Wh, 10:02-2 Wh, 10:03-2 Wh, 10:04-2 Wh, 10:05-2 Wh. The data fields may be then stored either in the memory 202 of the apparatus 200, in particular in the database 208 as an additional attribute of the new message (i.e. its association to the older message). The energy consumption distribution is thus obtained between 10:00 and 10:05. Although this energy consumption distribution presents averaged data about the energy consumption at the EV charging station 102, but it allows a station operator to have a clue about the use rate of the EV charging station 102 at a certain time.

If the data center 110 of the EV charging network 100 receives new messages from all of the EV charging stations 102, 104, 106, and 108, the method 300 is then performed in respect of each of the new messages. As a result, and assuming that the database 208 comprises a suitable older message for each of the new messages, there will be an energy consumption distribution associated with each of the EV charging stations 102, 104, 106, and 108 and obtained as explained above. This allows one to determine an average total energy consumption in the EV charging network 100 at a certain time. For example, if the average energy consumption is equal to 2 Wh at 10:03 at the EV charging station 102, 4 Wh at 10:03 at the EV charging station 104, 6 Wh at 10:03 at the EV charging station 106, and 8 Wh at 10:03 at the EV charging station 108, then the total average energy consumption in the EV charging network 100 at 10:03 will be 2+4+6+8=20 Wh.

In one embodiment, the method 300 may further comprise the step of conversing the average energy consumption in Watt-hour or Watt-hour multiples (or in any other energy units) into an average power consumption in Watt (W) for each EV charging station at certain times. As is well known, energy (E) is equivalent to power (P) multiplied by time (t), i.e. E=P·t. Given the example above, this means that the average power consumption at 10:03 at the EV charging station 102 is equal to P=2 Wh/(1/60 h)=120 W. By so doing, such conversion results in obtaining an average power consumption distribution between the timestamps of the new and older messages received from the EV charging station 102. Similar to the energy consumption distribution, the power consumption distribution may be then stored in the memory 202 of the apparatus 200, in particular in the database 208. Of course, similar power consumption distributions may be obtained for the other EV charging stations 104, 106, and 108, if required.

Correspondingly, the total average power consumption in the EV charging network 100 at a certain time may be calculated by comparing the power consumption distributions for the EV charging stations 102, 104, 106, and 108. To do this, the processor 204 of the apparatus 200 may properly query the database 208. For example, a database query may look as follows (given that the message attribute "timestamp" is divided into sub-attributes "year", "month", "day", "hour", "minute", etc.):

"Calculate the sum of all power consumption values satisfying the following conditions:
Station_ID_location='Finland'
and Timestamp_year=2018
and Timestamp_month=10
and Timestamp_day=22
and Timestamp_hour=13
and Timestamp_minute=4".

With the query above, the processor 204 may readily retrieve information about the average total power consumption at all EV charging stations located in Finland at 2018-10-22 13:04:00.

Figure 4:
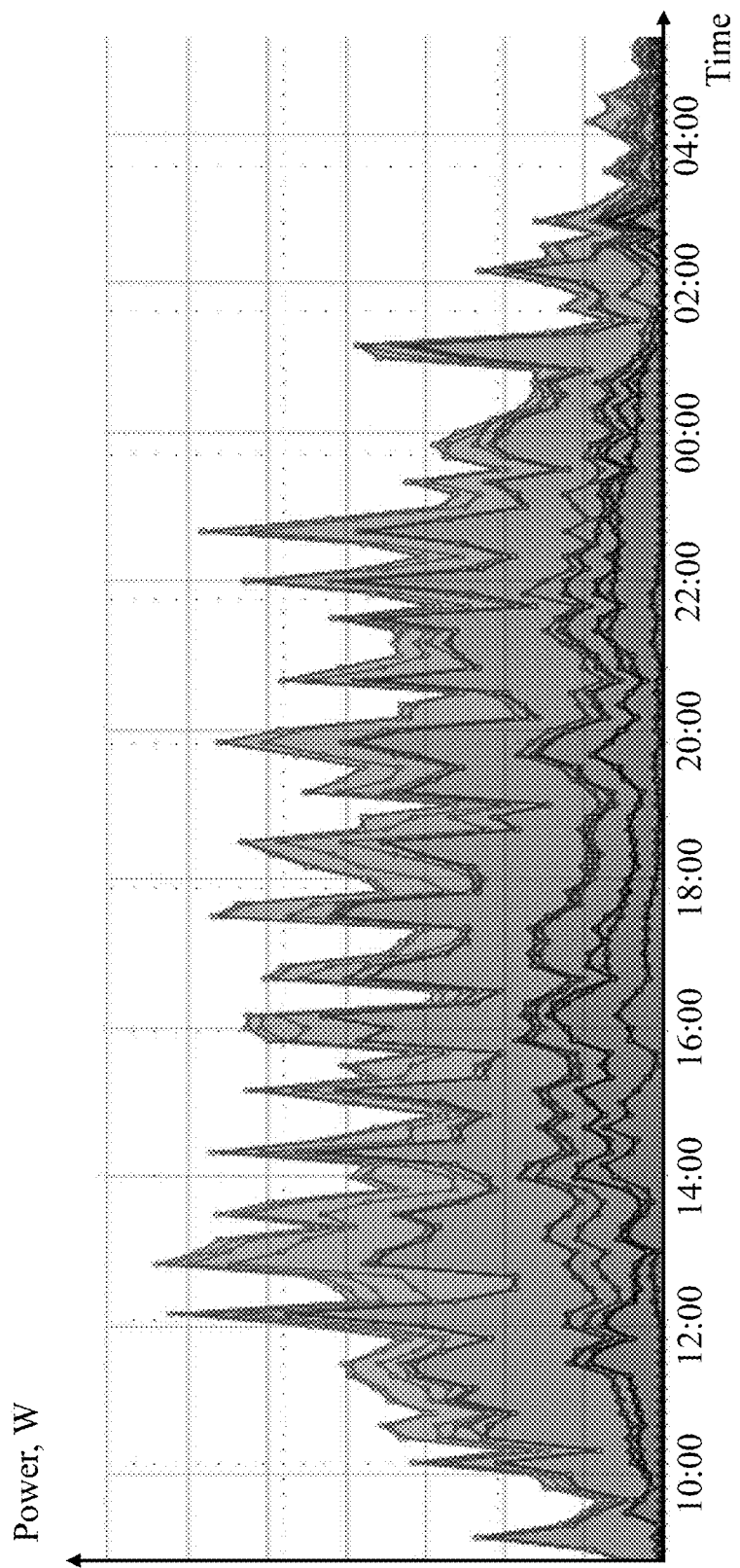
FIG. 4 shows dependences of power consumption during the day at the EV charging stations, which are obtained by using the method of FIG. 3.

FIG. 4 shows multiple dependences of the average power consumption on time for multiple EV charging stations in the EV charging network. Each dependence corresponds to one EV charging station and is obtained by using the method 300, with each point on the dependence representing the sum of all power consumption values corresponding to different charging session IDs and the same station ID at a certain time. By using such dependences, one can get an insight into the use rate of any available EV charging station, as well as determine a time period when the use rate is the highest for any one or all of the available EV charging stations. This information may then be used to optimize EV charging and energy production at the EV charging stations.

Those skilled in the art should understand that each block or step of the method 300, or any combinations of the blocks or steps, can be implemented by various means, such as hardware, firmware, and/or software. As an example, one or more of the blocks or steps described above can be embodied by computer executable instructions, data structures, program modules, and other suitable data representations. Furthermore, the computer executable instructions which embody the blocks or steps described above can be stored on a corresponding data carrier and executed by at least one processor like the processor 204 of the apparatus 200. This data carrier can be implemented as any computer-readable storage medium configured to be readable by said at least one processor to execute the computer executable instructions. Such computer-readable storage media can include both volatile and nonvolatile media, removable and non-removable media. By way of example, and not limitation, the computer-readable media comprise media implemented in any method or technology suitable for storing information. In more detail, the practical examples of the computer-readable media include, but are not limited to information-delivery media, RAM, ROM, EEPROM, flash memory or other memory technology, CD-ROM, digital versatile discs (DVD), holographic media or other optical disc storage, magnetic tape, magnetic cassettes, magnetic disk storage, and other magnetic storage devices.

Although the exemplary embodiments of the present disclosure are described herein, it should be noted that any various changes and modifications could be made in the embodiments of the present disclosure, without departing from the scope of legal protection which is defined by the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method for monitoring energy consumption in an electric vehicle (EV) charging network, wherein the EV charging network comprises multiple EV charging stations each equipped with an energy meter, and wherein the method comprises, by at least one processor:
   a) receiving a new message from at least one of the EV charging stations, the new message comprising a timestamp, a station identifier (ID), a charging session ID unique for each charging session, and an energy meter reading;
   b) storing the new message in a database comprising old messages from the EV charging stations;
   c) checking whether the database comprises an older message comprising the same station ID and charging session ID as the new message;
   d) if the older message is present in the database, calculating a time difference and an energy difference between the new message and the older message;
   e) selecting a time granularity level based on the calculated time difference;
   f) obtaining an energy consumption distribution between the timestamps of the new message and the older message based on the time granularity level and the energy difference; and
   g) providing the energy consumption distribution to a station operator.

2. The method of claim 1, wherein the station ID comprises a name, manufacturer information and/or geographical location of the EV charging station.

3. The method of claim 1, wherein the charging session ID is represented by one or more letter and/or digital characters.

4. The method of claim 1, further comprising storing the energy consumption distribution in the database.

5. The method of claim 1, wherein said obtaining the energy consumption distribution comprises:
   dividing the time difference between the new message and the older message into a number of equal time intervals in accordance with the time granularity level; and
   calculating an average energy consumption for each time interval by dividing the energy difference by the number of equal time intervals.

6. The method of claim 5, wherein the energy meter readings and the average energy consumption are given in Watt-hour or Watt-hour multiples.

7. The method of claim 6, further comprising:
calculating an average power consumption for each time interval by converting the average energy consumption expressed in Watt-hour or Watt-hour multiples into Watt;
obtaining a power consumption distribution between the timestamps of the new message and the older message based on the time granularity level and the average power consumption; and
storing the power consumption distribution in the database.

8. The method of claim 1, wherein steps a)-g) are performed for the new messages received from the other EV charging stations, and wherein the method further comprises calculating a total energy consumption in the EV charging network at a given time by comparing the energy consumption distributions obtained for the EV charging stations.

9. A computer program product comprising a computer readable storage medium, wherein the storage medium stores computer executable instructions which, when executed by at least one processor, cause the at least one processor to perform the method of claim 1.

10. An apparatus for monitoring energy consumption in an electric vehicle (EV) charging network, wherein the EV charging network comprises multiple EV charging stations each equipped with an energy meter, the apparatus comprising:
at least one processor, and
a memory coupled to the at least one processor,
wherein the memory stores a database comprising old messages from the EV charging stations, each of the old messages comprising a timestamp, a station identifier (ID), a charging session ID unique for each charging session, and an energy meter reading, and the memory further stores processor-executable instructions which, when executed by the at least one processor, cause the at least one processor to:
a) receive a new message from at least one of the EV charging stations;
b) store the new message in the database;
c) check whether the database comprises an older message comprising the same station ID and charging session ID as the new message;
d) if the older message is present in the database, calculate a time difference and an energy difference between the new message and the older message;
e) select a time granularity level based on the calculated time difference;
f) obtain an energy consumption distribution between the timestamps of the new message and the older message based on the time granularity level and the energy difference; and
g) provide the energy consumption distribution to a station operator.

11. The apparatus of claim 10, wherein the station ID comprises a name, manufacturer information and/or geographical location of the EV charging station.

12. The apparatus of claim 10, wherein the charging session ID is represented by one or more letter and/or digital characters.

13. The apparatus of claim 10, wherein the memory further comprises computer-executable instructions causing the at least one processor to store the energy consumption distribution in the memory or the database.

14. The apparatus of claim 10, wherein the at least one processor is configured to obtain the energy consumption distribution by:
dividing the time difference between the new message and the older message into a number of equal time intervals in accordance with the time granularity level; and
calculating an average energy consumption for each time interval by dividing the energy difference by the number of equal time intervals.

15. The apparatus of claim 14, wherein the energy meter readings and the average energy consumption are given in Watt-hour or Watt-hour multiples.

16. The apparatus of claim 15, wherein the memory further comprises computer-executable instructions causing the at least one processor to:
calculate an average power consumption for each time interval by conversing the average energy consumption expressed in Watt-hour or Watt-hour multiples into Watt;
obtain a power consumption distribution between the timestamps of the new message and the older message based on the time granularity level and the average power consumption; and
storing the power consumption distribution in the memory or the database.

17. The apparatus of claim 10, wherein the at least one processor is configured to perform operations a)-g) for the new messages received from the other EV charging stations, and wherein the memory further comprises computer-executable instructions causing the at least one processor to calculate a total energy consumption in the EV charging network at a given time by comparing the energy consumption distributions obtained for all the EV charging stations.

* * * * *